(12) United States Patent
Nehrke et al.

(10) Patent No.: US 10,591,565 B2
(45) Date of Patent: Mar. 17, 2020

(54) PARALLEL MR IMAGING WITH RF COIL SENSITIVITY MAPPING

(71) Applicant: KONINKLIJKE PHILIPS N.V., Eindhoven (NL)

(72) Inventors: Kay Nehrke, Hamburg (DE); Peter Boernert, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 109 days.

(21) Appl. No.: 15/572,182

(22) PCT Filed: Apr. 28, 2016

(86) PCT No.: PCT/EP2016/059454
§ 371 (c)(1),
(2) Date: Nov. 7, 2017

(87) PCT Pub. No.: WO2016/180640
PCT Pub. Date: Nov. 17, 2016

(65) Prior Publication Data
US 2018/0120402 A1    May 3, 2018

(30) Foreign Application Priority Data
May 13, 2015   (EP) .................................... 15167607

(51) Int. Cl.
*G01R 33/561*    (2006.01)
*G01R 33/24*     (2006.01)
*G01R 33/56*     (2006.01)

(52) U.S. Cl.
CPC ........ *G01R 33/5611* (2013.01); *G01R 33/243* (2013.01); *G01R 33/246* (2013.01); *G01R 33/5608* (2013.01); *G01R 33/5612* (2013.01)

(58) Field of Classification Search
CPC ............ G01R 33/5611; G01R 33/5608; G01R 33/243; G01R 33/246; G01R 33/5612
See application file for complete search history.

(56) References Cited

U.S. PATENT DOCUMENTS

| | | | |
|---|---|---|---|
| 2015/0002149 A1* | 1/2015 | Nehrke | G01R 33/243 324/309 |
| 2015/0042335 A1* | 2/2015 | Nehrke | G01R 33/5659 324/309 |
| 2016/0252595 A1* | 9/2016 | Nehrke | A61B 5/055 324/309 |

FOREIGN PATENT DOCUMENTS

| | | |
|---|---|---|
| WO | 2013105006 A1 | 7/2013 |
| WO | 2014053927 A1 | 4/2014 |

OTHER PUBLICATIONS

Nehrke et al "Dream—A Novel Approach for Robust, Ultrafast, Multislice B1 Mapping" Magnetic Resonance in Med. 68, p. 1517-1526 2012.

(Continued)

*Primary Examiner* — G. M. A Hyder

(57) ABSTRACT

The invention relates to a method of MR imaging of an object (10). The problem of the invention is to provide an improved MR imaging technique that enables fast and robust determination of spatial sensitivity profiles of RF receiving antennas (11, 12, 13) used in parallel imaging as well as B1 and/or B0 mapping. The method of the invention comprises subjecting the object (10) to a stimulated echo sequence. Two or more stimulated echo signals (STE, STE*) are acquired, namely a direct stimulated echo signal (STE) and a conjugated stimulated echo signal (STE*), wherein at least one of the stimulated echo signals (STE, STE*) is received in parallel via an array of two or more RF receiving antennas (11, 12, 13) having different spatial sensitivity profiles, and wherein at least another one of the stimulated (Continued)

echo signals (STE, STE*) is received via a body RF coil (9) having an essentially homogeneous spatial sensitivity profile. Sensitivity maps indicating the spatial sensitivity profiles of the individual RF receiving antennas (11, 12, 13) of the array are derived by comparing the stimulated echo signals (STE, STE*) received via the array of RF receiving antennas (11, 12, 13) with the stimulated echo signals (STE, STE*) received via the body RF coil (9). Moreover, the invention relates to a MR device (1) and to a computer program for a MR device (1).

9 Claims, 2 Drawing Sheets

(56) References Cited

OTHER PUBLICATIONS

Nehrke et al "Volumetric B1+Mapping of the Brain at 7T Using Dream" Magnetic Resonance in Med. vol. 71, p. 246-256 (2014).

\* cited by examiner

PARALLEL MR IMAGING WITH RF COIL SENSITIVITY MAPPING

CROSS REFERENCE TO RELATED APPLICATIONS

This application is a U.S. national phase application of International Application No. PCT/EP2016/059454, filed on Apr. 28, 2016, which claims the benefit of EP Application Serial No. 15167607.9 filed on May 13, 2015 and is incorporated herein by reference.

FIELD OF THE INVENTION

The invention relates to the field of magnetic resonance (MR) imaging. It concerns methods of MR imaging of at least a portion of a body. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field ($B_0$ field) whose direction at the same time defines an axis (normally the z-axis) of the coordinate system on which the measurement is based. The magnetic field produces different energy levels for the individual nuclear spins in dependence on the magnetic field strength. These energy levels can be excited (spin resonance) by application of an electromagnetic alternating field (RF field, also referred to as $B_1$ field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the magnetic field extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of one or more receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The MR signal data obtained via the RF coils corresponds to the spatial frequency domain and is called k-space data. The k-space data usually includes multiple lines acquired with different phase encoding. Each line is digitized by collecting a number of samples. A set of k-space data is converted to a MR image by means of Fourier transformation.

Known parallel acquisition techniques are used widely in MR imaging for accelerating the MR signal acquisition. A method in this category is SENSE (Sensitivity Encoding). SENSE and other parallel acquisition techniques use undersampled k-space data acquisition obtained from multiple RF receiving antennas in parallel, wherein the RF receiving antennas have different spatial sensitivity profiles. In these methods, the (complex) signal data from the multiple RF receiving antennas are combined with complex weightings in such a way as to suppress undersampling artifacts (aliasing) in the finally reconstructed MR images. This type of complex RF coil array signal combination is sometimes referred to as spatial filtering and includes combining in the k-space domain or in the image domain (in SENSE), as well as methods which are hybrids.

In SENSE imaging, coil sensitivity profiles are typically estimated from low-resolution reference data obtained by a SENSE reference scan. This coil sensitivity information is then used during image reconstruction to "unwrap" aliased pixels in image space using a direct inversion algorithm.

Conventionally, the MR device employed for a given diagnostic imaging task automatically detects when a SENSE reference scan is required depending on the type and the parameters of the selected imaging sequence. The SENSE reference scan is automatically inserted into the list of sequences to be performed, typically immediately before the diagnostic imaging sequence.

The SENSE reference scan usually includes two scans because MR signal data have to be acquired (i) via the multiple RF receiving antennas of which the spatial sensitivity profiles are to be determined and (ii) via a body RF coil having an essentially homogeneous spatial sensitivity profile as a reference. These two scans have to be performed separately for the reason of decoupling the array of RF receiving antennas from the body RF coil.

Moreover, an accurate measurement of the spatial distribution of the transmitted RF field is often important for many MR imaging applications (particularly at high main magnetic field strengths of 3 Tesla or more) to support appropriate prospective (if applicable) and retrospective correction/compensation. This requires a robust and fast $B_1$ mapping technique. However, most $B_1$ mapping techniques are relatively slow, making integration into the clinical workflow difficult. The international application WO2013/05006 mentions formation of a $B_1$ map indicating the spatial distribution of the RF field of the RF pulses within the portion of the body (10) from acquired FID and stimulated echo signals.

Sometimes, also the distribution of the main magnetic field $B_0$ needs to be determined in a preparation scan prior to the actual diagnostic scan. This enables $B_0$ shimming and/or compensation of $B_0$ inhomogeneities during MR image reconstruction.

All these different preparation scans significantly increase the total scan time.

SUMMARY OF THE INVENTION

From the foregoing it is readily appreciated that there is a need for an improved MR imaging technique that enables fast and robust determination of sensitivity profiles of the used RF receiving antennas as well as $B_1$ and/or $B_0$ mapping.

In accordance with the invention, a method of MR imaging of an object placed in the examination volume of a MR device is disclosed. The method comprises the steps of:
subjecting the object to an imaging sequence of RF pulses and switched magnetic field gradients, which imaging sequence is a stimulated echo sequence including:
i) at least two preparation RF pulses radiated toward the object during a magnetization preparation period, and
ii) one or more reading RF pulses radiated toward the object during an acquisition period temporally subsequent to the magnetization preparation period;
acquiring two or more stimulated echo signals after each reading RF pulse during the acquisition period, namely a direct stimulated echo signal and a conjugated stimulated echo signal, wherein at least one of the stimulated echo signals is received in parallel via an array of two or more RF receiving antennas having different spatial sensitivity profiles, and wherein at least another one of the stimulated echo signals is received via a body RF coil having an essentially homogeneous spatial sensitivity profile; and
deriving sensitivity maps indicating the spatial sensitivity profiles of the individual RF receiving antennas of the array by comparing the stimulated echo signals received via the array of RF receiving antennas with the stimulated echo signals received via the body RF coil.

In general, a stimulated echo sequence comprises three (for example 60° or 90°) RF pulses, wherein the first two RF pulses are magnetization preparation pulses. The first preparation RF pulse excites magnetic resonance and transforms the longitudinal nuclear magnetization into transverse nuclear magnetization. The second preparation RF pulse "stores" a fraction of the de-phased transverse nuclear magnetization along the longitudinal axis. In case of 90° RF pulses this fraction is almost half of the de-phased transverse magnetization. The third RF pulse is applied during the acquisition period which is temporally subsequent to the preparation period. The third RF pulse ("reading RF pulse") transforms the stored longitudinal nuclear magnetization into transverse nuclear magnetization again, thereby generating a so-called stimulated echo. MR imaging on the basis of stimulated echoes can be accelerated by replacing the third RF pulse by a train of low-flip angle reading RF pulses, wherein each reading RF pulse refocuses only a small portion of the longitudinal nuclear magnetization stored after the preparation period.

The method of the invention adopts the recently introduced DREAM $B_1$ mapping approach (Magnetic Resonance in Medicine, 68, 1517-1526, 2012; Magnetic Resonance in Medicine, 71, 246-256, 2014) which allows the acquisition of a $B_1$ map in a short time interval. The DREAM approach includes a stimulated echo-type preparation phase in which locally effective flip angles of the RF pulses of the preparation phase are encoded into longitudinal magnetization. This flip angle information is obtained in a subsequent acquisition phase in which a FID signal (free induction decay) and a stimulated echo signal are acquired quasi-simultaneously under a single readout gradient lobe. A $B_1$ map indicating the spatial distribution of the local flip angle (i.e. the local amplitude of the RF pulses of the preparation phase) is then derived from the amplitudes of the FID and stimulated echo signals acquired in a single acquisition train.

According to the invention, two stimulated echo signals, namely a direct stimulated echo signal and a virtual 'conjugated' stimulated echo signal (which represents the complex conjugated counterpart of the stimulated echo) are acquired after each reading RF pulse during the acquisition period. Preferably, the direct stimulated echo signal and the conjugated stimulated echo signal are acquired as gradient-recalled echo signals. This enables to acquire the stimulated echo signals, from which the spatial sensitivity maps are derived, quasi simultaneously. Thereby reducing undesirable phase wrapping and $T_2$ effects.

In accordance with the invention, like in the known DREAM approach, one or more reading RF pulses are applied during the acquisition period of the stimulated echo sequence, wherein the two or more stimulated echo signals are acquired quasi-simultaneously after each reading RF pulse. The two (direct and conjugated) stimulated echo signals of the DREAM sequence are almost identical, because they develop from the same stimulated echo-encoded longitudinal magnetization. Chemical shift effects can be neutralized by proper timing of the sequence. Therefore, SENSE reference data can be obtained in a single scan by acquiring MR signal data both via the array of RF receiving antennas and via the body RF coil from the stimulated echo signals. The two or more stimulated echoes are separated by a short time interval of approximately 1-2 ms, which is sufficiently long to switch signal reception between the body RF coil and the array of RF receiving antennas.

One MR image can be reconstructed for a given RF receiving antenna from the stimulated echo signals received via this RF receiving antenna. Another MR image can be reconstructed from the stimulated echo signals received via the body RF coil. After the MR image reconstruction, the spatial sensitivity map of the respective RF receiving antenna can be derived from the voxel-wise ratio of the two MR images. This can be performed for each individual RF receiving antenna of the array.

The method of the invention thus enables fast sensitivity mapping for parallel imaging by application of a single DREAM-type preparation sequence.

In a preferred embodiment of the invention, also one or more FID signals are acquired during the acquisition period. Like in the conventional DREAM approach, a $B_1$ map can then be derived from the voxel-wise intensity ratios of the FID and stimulated echo signals. The FID signals and the stimulated echo signals are acquired quasi-simultaneously. A MR image can be reconstructed from the FID signals and a further MR image can be reconstructed from the stimulated echo signals. After the MR image reconstruction, the $B_1$ map can be derived from the voxel-wise intensity ratio of these two MR images reconstructed from the FID and stimulated echo signals respectively.

Hence, the method of the invention enables to acquire not only the spatial sensitivity maps of the RF receiving antennas, but also a $B_1$ map in a single pre-scan.

A plurality of FID signals and stimulated echo signals with appropriate phase encoding need to be acquired for generating complete spatial sensitivity maps and/or a complete $B_1$ map. Efficient sampling schemes like, e.g., EPI can be advantageously applied for this purpose in combination with the invention.

In accordance with a preferred embodiment of the invention, the FID and the stimulated echo signals are acquired after each reading RF pulse as gradient-recalled echo signals. As mentioned above, the timing of the sequence (the echo times) can be adjusted such that susceptibility- and chemical shift-induced effects are essentially equal for the two direct and conjugated stimulated echo signals and/or the FID. This means, in other words, that the parameters of the imaging sequence (echo times, gradient strengths) of the invention are selected such that the contributions from water spins and from fat spins to the stimulated echo signals, from which the spatial sensitivity profiles are derived, and/or to the FID signal are essentially identical. For example, the signal contributions from water spins and signal contributions from fat spins may be essentially in phase in all stimulated echo signals. This renders the technique robust against chemical shift effects.

According to another preferred embodiment of the invention, a $B_0$ map indicating a spatial distribution of the main magnetic field within the examination volume is derived from the acquired FID and stimulated echo signals. Not only a $B_1$ map, but also a $B_0$ map can be derived from the voxel-wise complex signals of the FID and stimulated echo signals by using appropriate parameters of the imaging sequence. Thus, the spatial sensitivity maps of the RF receiving antennas, a $B_1$ map, and a $B_0$ map can be acquired simultaneously in a single pre-scan without additional measurement steps.

The method of the invention is a potential candidate for a global preparation scan in MR imaging, since it can be used to obtain the sensitivity information for parallel imaging as well as $B_1/B_0$ maps. The stimulated echo-based sensitivity mapping technique of the invention allows the sensitivity maps to be acquired in a single shot of the stimulated echo sequence in about 100 ms duration, making this approach in principle real-time capable.

The method of the invention described thus far can be carried out by means of a MR device including at least one main magnet coil for generating a uniform steady magnetic field within an examination volume, a number of gradient coils for generating switched magnetic field gradients in different spatial directions within the examination volume, at least one RF coil for generating RF pulses within the examination volume for receiving MR signals from a body of a patient positioned in the examination volume, a control unit for controlling the temporal succession of RF pulses and switched magnetic field gradients, and a reconstruction unit for reconstructing MR images from the received MR signals. The method of the invention is preferably implemented by a corresponding programming of the reconstruction unit and/or the control unit of the MR device.

The methods of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
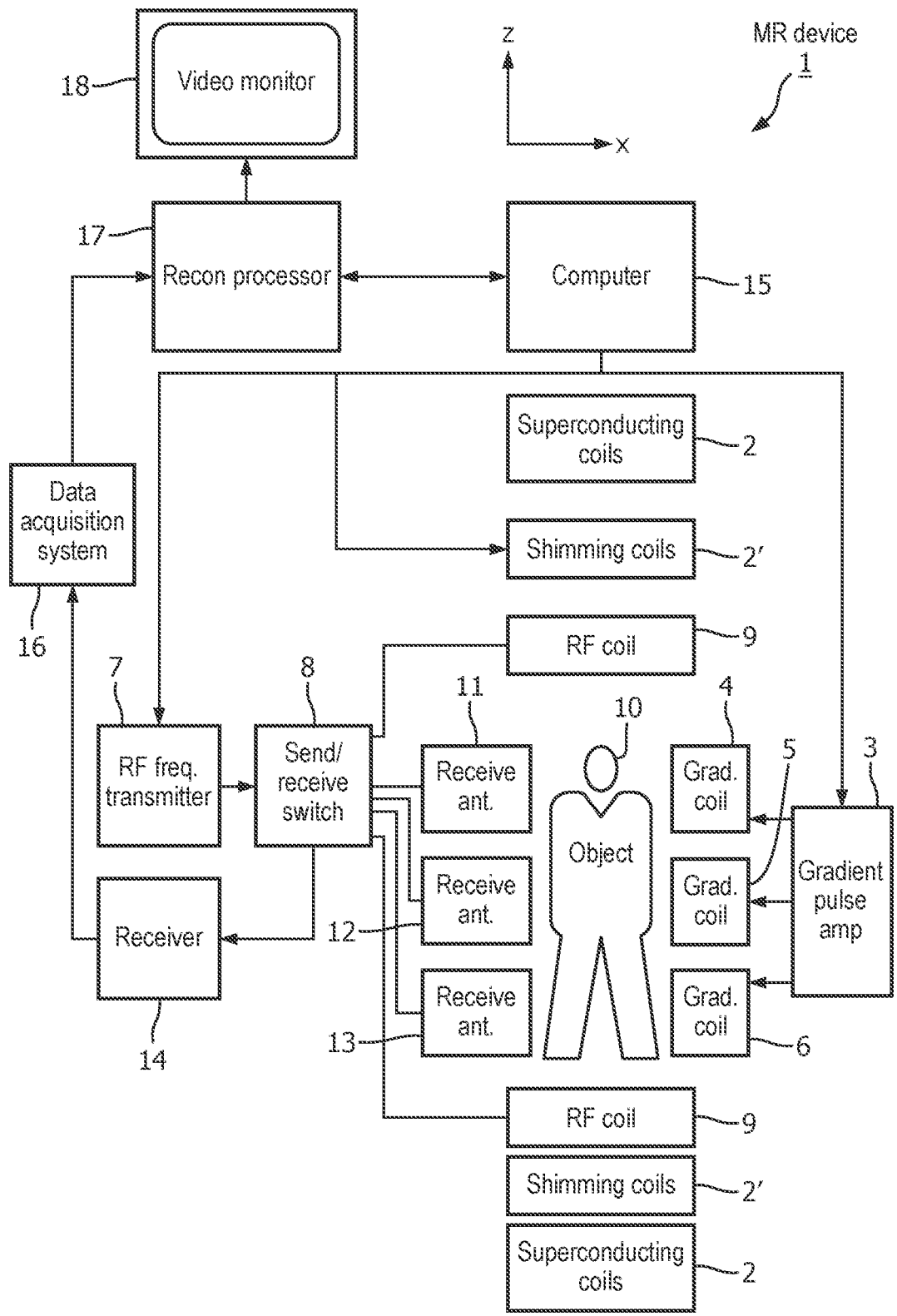
FIG. 1 schematically shows a MR device for carrying out the methods of the invention.

With reference to FIG. 1, a MR device 1 is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a body RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9 which has an essentially homogeneous spatial sensitivity.

For generation of MR images of limited regions of the body 10 by means of parallel imaging, a set of local array RF coils 11, 12, 13 having different spatial sensitivity profiles are placed contiguous to the region selected for imaging. The array coils 11, 12, 13 can be used to receive MR signals induced by body-coil RF transmissions. In parallel transmit applications, the array RF coils 11, 12, 13 may also be used for RF transmission, for example for the purpose of RF shimming.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send/receive switch 8.

A host computer 15 controls the current flow through the shimming coils 2' as well as the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms, such like SENSE or SMASH. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

Figure 2:
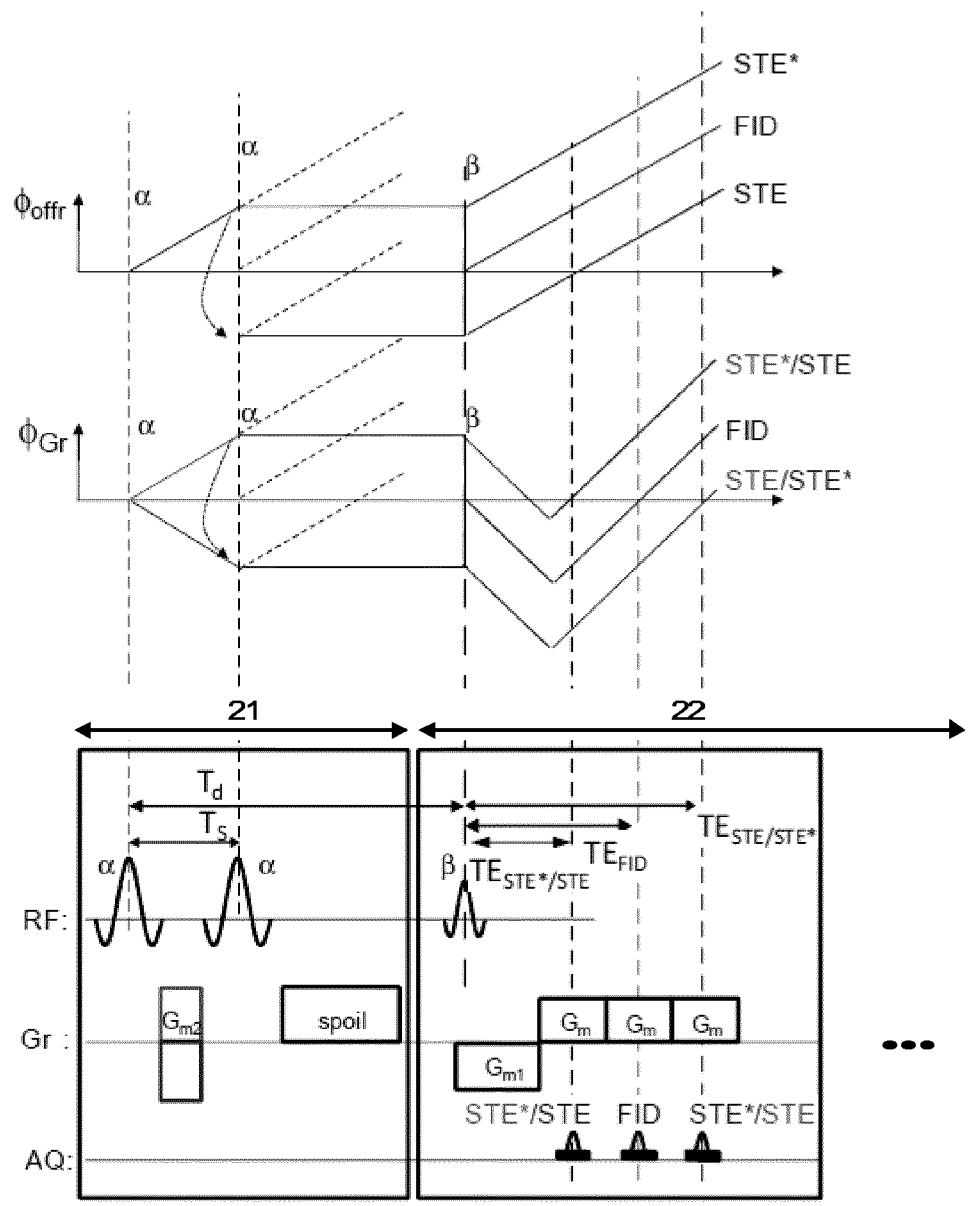
FIG. 2 shows a schematic diagram illustrating an imaging sequence according to the invention.

FIG. 2 shows a diagram illustrating an imaging sequence according to the invention.

The depicted imaging sequence is a stimulated echo sequence which is subdivided into a magnetization preparation period 21 and an acquisition period 22. Two preparation RF pulses having a flip angle of α are applied during the magnetization preparation period 21. The two preparation RF pulses are separated by a time interval $T_S$. A de-phaser magnetic field gradient $G_{m2}$ is applied between the two preparation RF pulses. A sequence of reading RF pulses having flip-angle are generated during the acquisition period 22, which is temporally subsequent to the preparation period 21. Each reading RF pulse β creates an FID signal, a stimulated echo STE and a conjugated stimulated echo STE* that are acquired as separate gradient-recalled echoes quasi-simultaneously under a single readout gradient lobe. The acquisition order is determined by the polarity of the de-phaser gradient $G_{m2}$. The timing of the three gradient echoes is controlled by the switched gradients $G_{m1}$, $G_m$ (illustrated by the lower phase graph $\Phi_{Gr}$).

Directly after the stimulated echo preparation period 21, the longitudinal nuclear magnetization is given by:

$$M_{z,FID} = \cos^2(\alpha) \cdot M_0$$

$$M_{z,STE} = \frac{1}{2}\sin^2(\alpha) \cdot M_0$$

$$M_{z,STE^*} = \frac{1}{2}\sin^2(\alpha) \cdot M_0$$

Where $M_{z,FID}$ denotes the unprepared (i.e. in-phase) longitudinal magnetization, and $M_{z,STE}$ and $M_{z,STE^*}$ denote the two mirrored stimulated echo-prepared (i.e. de-phased) longitudinal magnetization contributions. The transverse magnetization components (i.e. the FID from the first RF pulse α, the FID and the spin echo from second RF pulse α) are spoiled by a strong crusher gradient and will not be further considered.

According to the invention, the stimulated echo STE is received in parallel via the array of array RF coils 11, 12, 13 having different spatial sensitivity profiles. The conjugated stimulated echo signal STE* is received via the body RF coil 9 which has an essentially homogeneous spatial sensitivity. The two stimulated echoes STE, STE* are separated by a time interval of approximately 1-2 ms, which is sufficiently long to switch signal reception between the array of RF coils 11, 12, 13 and the body RF coil 9 by means of send/receive switch 8. The FID signal can be received, for example, also in parallel via the array RF coils 11, 12, 13.

The reading RF pulse β of the imaging sequence thus generates three transverse signal contributions:

$$I_{FID} = S_A \cdot C(t) \sin(\beta) M_{z,FID}$$

$$I_{STE} = S_A \cdot C(t - T_S) \sin(\beta) M_{z,STE}$$

$$I_{STE^*} = S_{BC} \cdot C(t + T_S) \sin(\beta) M_{z,STE^*}$$

Therein $S_A$ and $S_{BC}$ each represent a complex system constant which comprises the receive coil sensitivity for the respective array RF coil ($S_A$) and for the body RF coil ($S_{BC}$) for a given voxel, and β is the nominal flip angle of the reading RF pulse. Furthermore, as mentioned above, $T_S$ is the time interval separating the two RF pulses in the preparation phase and C describes the static signal de-phasing for a given voxel due to susceptibility and chemical shift effects:

$$C(t) = \int_V \rho(r) e^{-i\omega(r) \cdot t} dr$$

Wherein ρ(r) and ω(r) denote proton density and off-resonance frequency offset, and the integral describes the summation over the given voxel. While the STE signal $I_{STE}$ refocuses as a stimulated echo, the STE* signal $I_{STE}^*$ further de-phases, and, hence, is therefore typically discarded in a conventional stimulated echo experiment. However, the imaging sequence shown in FIG. 2 employs tailored switched magnetic field gradients to acquire all three signal contributions as separate re-called gradient echoes at deliberately chosen echo times. The relations for the gradient areas A of the measurement gradient $G_m$, the re-phaser gradient $G_{m1}$ and the stimulated echo de-phaser gradient $G_{m2}$ are:

$$A(G_{m1}) = -1.5\, A(G_m)$$

$$A(G_{m2}) = \mp A(G_m)$$

The first equation ensures that the gradient echo of the FID is refocused at the centre of the second readout gradient $G_m$. The second equation ensures that the direct stimulated echo STE and the conjugated stimulated echo STE* are refocused at the centre of the first and third readout gradient $G_m$, respectively. The acquisition order (STE-FID-STE* or STE*-FID-STE) is determined by the polarity of the stimulated echo de-phaser gradient $G_{m2}$ relative to the readout gradient $G_m$.

Within the general sequence timing constraints resulting from e.g. acquisition bandwidth or RF and gradient power limitations, the gradient echoes times (i.e. time of the gradient echo top) may be independently selected to obtain a desired spectral encoding for the different echoes. For example, an equidistant timing scheme for the three gradient echoes could be applied by concatenating the three readout gradients $G_m$ to a single, constant gradient lobe. If, additionally, the time interval between the STE/STE* and the FID signals, ΔT, is chosen equal to $T_S$, the STE and STE* signals have the same spectral encoding time, namely $TE_{FID}$ and differ only in the $T_2$ evolution time, which is $TE_{FID} + 2T_S$ for the stimulated echo STE and $TE_{FID}$ for the conjugated echo STE*. Hence, MR images reconstructed from the STE and STE* signals are identical and differ only by $T_2$ relaxation and their respective system constants $S_A$ and $S_{BC}$. As mentioned above, the timing can be selected such that the two stimulated echoes STE, STE* are separated by a time interval of only 1-2 ms such that $T_2$ relaxation can be neglected. The spatial sensitivity maps of the array RF coils 11, 12, 13 can thus be derived directly from the voxel-wise ratio of the stimulated echoes STE and STE* ($I_{STE}/I_{STE^*}$, see above) which can be calculated for each individual RF receiving coil 11, 12, 13 of the array.

In addition, as in the known DREAM approach (see above), the flip angle α of the stimulated echo preparation RF pulses (and thus the $B_1$ map) can be derived from the ratio of the acquired stimulated echo and FID signals according to:

$$\alpha = \arctan\sqrt{2|I_{STE}/I_{FID}|}$$

If $T_S$ is set to $T_S = \Delta T + TE_{FID}$, a $B_0$ phase map can be derived from the phase of the two signals:

$$\phi_{B_0} = \arg(I_{STE} \cdot I^*_{FID})$$

This applies under the provision that the FID is acquired at a fat/water in-phase echo time (e.g. 2.3 ms at 3 Tesla). In this case, the FID and the stimulated echoes are acquired at different water/fat in-phase spectral encoding times (e.g. 4.6 ms for STE*, 2.3 ms for FID and 0 ms for STE at 3 Tesla). Thus the STE and STE* signals would also differ by $T_2^*$ relaxation, but $T_2^*$ and $T_2$ effects at least partly cancel out, since the STE stimulated echo has a stronger $T_2$- and a weaker $T_2^*$-weighting than the STE* stimulated echo.

The invention claimed is:

1. A method of magnetic resonance (MR) imaging of an object placed in the examination volume of a MR device, the method comprising:
    subjecting the object to an imaging sequence of RF pulses and switched magnetic field gradients, which imaging sequence is a stimulated echo sequence including:
    i) at least two preparation RF pulses (α) radiated toward the object during a magnetization preparation period, and
    ii) one or more reading RF pulses (β) radiated toward the object during an acquisition period temporally subsequent to the magnetization preparation period;
    acquiring two or more stimulated echo signals (STE, STE*) after each reading RF pulse (β) during the acquisition period, namely a direct stimulated echo signal (STE) and a conjugated stimulated echo signal (STE*), wherein at least one of the stimulated echo signals (STE, STE*) is received in parallel via an array of two or more RF receiving antennas having different spatial sensitivity profiles, and wherein at least another one of the stimulated echo signals (STE, STE*) is received via a body RF coil having an essentially homogeneous spatial sensitivity profile; and deriving sensitivity maps indicating the spatial sensitivity profiles of the individual RF receiving antennas of the array by comparing the stimulated echo signals (STE, STE*) received via the array of RF receiving antennas with the stimulated echo signals (STE, STE*) received via the body RF coil.

2. The method of claim 1, wherein one or more FID signals are acquired during the acquisition period.

3. The method of claim 2, wherein a B1 map is derived from the voxel-wise intensity ratios of the FID and stimulated echo signals.

4. The method of claim 1, wherein a plurality of FID and stimulated echo (STE, STE*) MR signals are generated by means of a plurality of consecutive reading RF pulses (β).

5. The method of claim 1, wherein the FID signals and/or the two or more stimulated echo signals (STE, STE*) are acquired as gradient-recalled echo signals.

6. The method of claim 1, wherein a $B_0$ map indicating a spatial distribution of the main magnetic field within the examination volume is derived from the acquired FID and stimulated echo signals (STE, STE*).

7. The method of claim 1, wherein the parameters of the imaging sequence are selected such that the contributions from water spins and from fat spins to the stimulated echo signals (STE, STE*), from which the spatial sensitivity profiles are derived, are essentially identical.

8. A magnetic resonance (MR) device comprising: at least one main magnet coil for generating a uniform, steady magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit for reconstructing MR images from the received MR signals, wherein the MR device is configured to perform the following steps:
    subjecting the object to an imaging sequence of RF pulses and switched magnetic field gradients, which imaging sequence is a stimulated echo sequence including:
    i) at least two preparation RF pulses (α) radiated toward the object during a magnetization preparation period, and
    ii) one or more reading RF pulses (β) radiated toward the object during an acquisition period temporally subsequent to the magnetization preparation period;
    acquiring two or more stimulated echo signals (STE, STE*) after each reading RF pulse (β) during the acquisition period, namely a direct stimulated echo signal (STE) and a conjugated stimulated echo signal (STE*), wherein at least one of the stimulated echo signals (STE, STE*) is received in parallel via an array of two or more RF receiving antennas having different spatial sensitivity profiles, and wherein at least another one of the stimulated echo signals (STE, STE*) is received via a body RF coil having an essentially homogeneous spatial sensitivity profile; and deriving sensitivity maps indicating the spatial sensitivity profiles of the individual RF receiving antennas of the array by comparing the stimulated echo signals (STE, STE*) received via the array of RF receiving antennas with the stimulated echo signals (STE, STE*) received via the body RF coil.

9. A non-transitory computer readable storage medium configured to store a computer program to be run on a magnetic resonance (MR) device, which computer program comprises instructions for: generating an imaging sequence of RF pulses and switched magnetic field gradients, which imaging sequence is a stimulated echo sequence including:
    i) at least two preparation RF pulses (α) radiated during a magnetization preparation period, and
    ii) one or more reading RF pulses (β) radiated during an acquisition period temporally subsequent to the magnetization preparation period;
    acquiring two or more stimulated echo signals (STE, STE*) after each reading RF pulse (β) during the acquisition period, namely a direct stimulated echo signal (STE) and a conjugated stimulated echo signal (STE*), wherein at least one of the stimulated echo signals (STE, STE*) is received in parallel via an array of two or more RF receiving antennas having different spatial sensitivity profiles, and wherein at least another one of the stimulated echo signals (STE, STE*) is received via a body RF coil having an essentially homogeneous spatial sensitivity profile; and deriving sensitivity maps indicating the spatial sensitivity profiles of the individual RF receiving antennas of the array by comparing the stimulated echo signals (STE, STE*) received via the array of RF receiving antennas with the stimulated echo signals (STE, STE*) received via the body RF coil.

\* \* \* \* \*